US008726212B1

(12) United States Patent
Huang et al.

(10) Patent No.: US 8,726,212 B1
(45) Date of Patent: May 13, 2014

(54) STREAMLINED PARASITIC MODELING WITH COMMON DEVICE PROFILE

(71) Applicant: Taiwan Semiconductor Manufacturing Company, Ltd., Hsin-Chu (TW)

(72) Inventors: Cheng-I Huang, Hsin-Chu (TW); Chung-Hsing Wang, Baoshan Township (TW); Hsiao-Shu Chao, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/773,452

(22) Filed: Feb. 21, 2013

(51) Int. Cl.
*G06F 17/50* (2006.01)

(52) U.S. Cl.
CPC ........ *G06F 17/5081* (2013.01); *G06F 17/5036* (2013.01)
USPC ............ 716/115; 716/112; 716/132; 716/136

(58) Field of Classification Search
None
See application file for complete search history.

(56) References Cited

U.S. PATENT DOCUMENTS

| | | | |
|---|---|---|---|
| 5,933,759 A | 8/1999 | Nguyen et al. | |
| 6,242,352 B1 | 6/2001 | Chen et al. | |
| 6,438,729 B1 * | 8/2002 | Ho | 716/113 |
| 7,082,587 B2 | 7/2006 | Chen et al. | |
| 7,231,628 B2 | 6/2007 | Pack et al. | |
| 7,531,449 B2 | 5/2009 | Park et al. | |
| 7,853,904 B2 | 12/2010 | White | |
| 7,870,381 B2 * | 1/2011 | Hekmatpour et al. | 713/152 |
| 7,879,727 B2 | 2/2011 | Postnikov et al. | |
| 7,906,253 B2 | 3/2011 | Aton et al. | |
| 8,001,512 B1 | 8/2011 | White | |
| 8,245,174 B2 | 8/2012 | Cheng et al. | |
| 8,312,406 B2 | 11/2012 | Song et al. | |
| 8,372,742 B2 | 2/2013 | Cheng et al. | |
| 2011/0193234 A1 | 8/2011 | Chen et al. | |
| 2012/0288786 A1 | 11/2012 | Huang et al. | |

OTHER PUBLICATIONS

Hanssen et al., "Robust Predictability of Parasitic Effects during the Physical Design of RF Products," 2011 IEEE, pp. 151-154.*
"StarRC", Synopsys, Inc., 2012, pp. 1-8.*
"QuickCap NX," Synopsys, Inc., 2012, pp. 1-3.*
Bencher, C., et al., "22nm Half Pitch Patterning by CVD Spacer Self Alignment Double Patterning (SADP)," Proc. of SPIE, 2008, 6924, pp. 69244E-1-69244E-7.

(Continued)

*Primary Examiner* — Leigh Garbowski
(74) *Attorney, Agent, or Firm* — Slater and Matsil, L.L.P.

(57) ABSTRACT

An embodiment method of streamlining parasitic modeling using a common device profile includes importing, using a processor, a simulated middle end of line (MEOL) profile into a characterization tool, generating, using the processor, a MEOL pattern based on the simulated MEOL profile, import, using the processor, the MEOL pattern and a real profile into a field solver to generate a MEOL capacitance table, updating, using the processor, capacitance data in the characterization tool based on the MEOL capacitance table generated, and generating, using the processor, a resistance and capacitance parasitic extraction technology file using the characterization tool with the capacitance data as updated.

20 Claims, 7 Drawing Sheets

(56) References Cited

OTHER PUBLICATIONS

Bubke, K., et al., "Mask Characterization for Double Patterning Lithography," Journal of Micro/Nanolithography, MEMS and MOEMS, 10 pages, Jan. 2009.

Cho, M., et al., "Double Patterning Technology Friendly Detailed Routing," IEEE/ACM International Conference on Computer-Aided Design, pp. 506-511, Nov. 2008.

Kruif, R., et al., "Wafer Based Mask Characterization for Double Patterning Lithography," 24th European Mask and Lithography Conference, pp. 71-82, Jan. 2008.

Mitra, et al., "RADAR: RET-Aware Detailed Routing Using Fast Lithography Simulations," Proceedings of the 42nd Design Automation Conference, pp. 369-372, Jun. 2005.

Notice of Co-Pending U.S. Appl. No. 12/907,640, filed Oct. 19, 2010.

* cited by examiner

STREAMLINED PARASITIC MODELING WITH COMMON DEVICE PROFILE

BACKGROUND

A foundry may employ a resistance and capacitance parasitic extraction (RCX) tool for microchip design. The RCX tool permits extraction of resistance, capacitance, and inductance of the on-chip metal interconnects.

When the foundry applies the RCX tool to a new process feature, the RCX tool typically generates process information corresponding to the new process feature. The foundry may want to share the process information with a customer. By doing so, the customer can develop a product implementing the new process feature. However, in order to protect sensitive information related to the new process feature, the foundry may have to share the process information with the customer in a less accurate format.

The foundry may also want to share the process information with the software company that developed the RCX tool. By doing so, the software company can improve the RCX tool. However, because the software company may provide the RCX tool to numerous other foundries, the foundry may end up inadvertently aiding its competitors and/or disclosing sensitive information.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely the design process associated with a fin field-effect transistor (FinFET) middle end of line (MEOL) structure. The disclosure may also be applied, however, to design processes for other integrated circuits, electronic structures, and the like.

Figure 1:
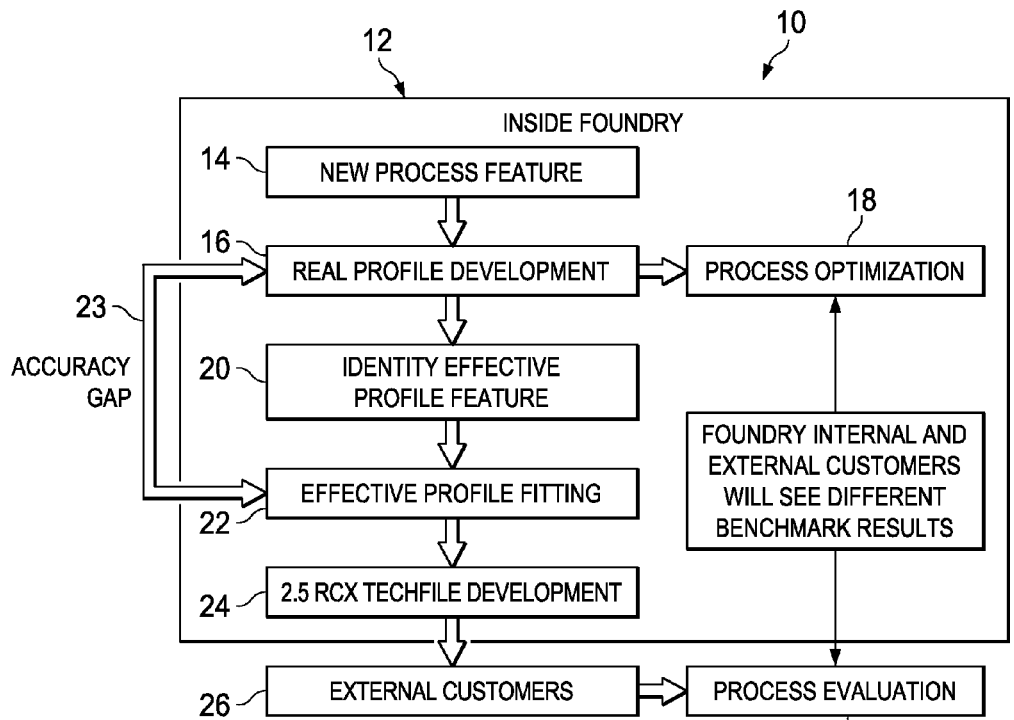
FIG. 1 illustrates a conventional process development flow inside a foundry.

Referring now to FIG. 1, a conventional process development flow 10 inside a foundry 12 is illustrated for reference. In block 14, a new process feature is developed. By way of example, the new process feature may be the design for a new process node, a new fin field effect transistor (FinFET) structure, and so on. In block 16, a real profile is developed based on the new process feature. In block 18, the foundry 12 applies the real profile to a resistance and capacitance parasitic extraction (RCX) tool in order to optimize the process and/or to generate benchmark results for the new process feature.

In block 20, the foundry 12 identifies any features within the new process feature that may be sensitive or contain propriety information. Those features incorporating sensitive or proprietary information are then simplified, approximated, generalized, simulated, and so on, through an effective profile fitting as shown in block 22. The effective profile protects the sensitive or proprietary information and prevents unintended disclosure to third parties (e.g., competitors). As shown in FIG. 1, because some of the features of the new process feature have been manipulated through the effective profile fitting to protect the sensitive or proprietary information, an accuracy gap 23 (a.k.a., accuracy loss) exists between the real profile development of block 16 and the effective profile fitting of block 22.

In block 24, the effective profile fitting is used to develop a two-and-a-half dimension (2D) RCX techfile. Once developed, the 2.5D RCX techfile may be shared with external customers 26 outside the foundry 12. As shown in block 28, those customers may perform their own process evaluation of the new process feature and generate benchmark results. Unfortunately, the benchmark results generated by the foundry 12 based on the real profile and the benchmark results generated by the external customers 26 based on the effective profile may be significantly different. This is due, at least in part, to the accuracy gap 23.

While permitting a difference to exist between the benchmarks of the foundry 12 and the external customer 26 may be undesirable, it may be the only prudent or commercially reasonable way for the foundry 12 to protect the sensitive information in the real profile when the conventional process flow of FIG. 1 is employed.

Figure 2:
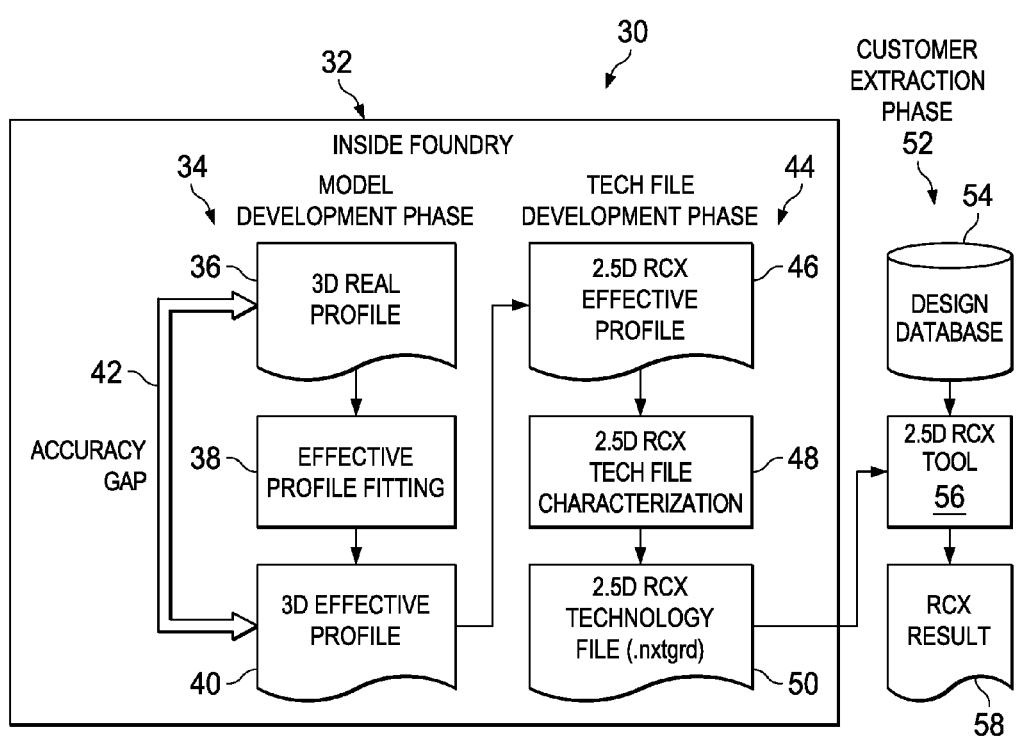
FIG. 2 illustrates another conventional process development flow inside a foundry.

Referring now to FIG. 2, another conventional process development flow 30 inside a foundry 32 is illustrated for reference. In the model development phase 34, a three-dimensional (3D) real profile 36 is generated from a new process feature. Again, the new process feature may contain sensitive information of the foundry 32. Therefore, in block 38 an effective profile fitting takes place in order to generate the 3D effective profile in block 40. As shown, an accuracy gap 42 exists between the 3D real profile in block 36 and the 3D effective profile in block 40 due to the effective profile fitting 38.

In the tech file development phase 44, a 2.5D RCX effective profile is developed in block 46 based on the 3D effective profile generated in the model development phase 34. Next, in block 48, a 2.5D RCX tech file characterization file is generated by a characterization tool. Generation of the 2.5D RCX tech file characterization file typically involves dividing the new design feature into patterns and using a look up table to determine the capacitance of those patterns. Thereafter, in block 50, a 2.5D RCX technology file is created based on the 2.5D RCX tech file characterization file.

In the customer extraction phase 52, the 2.5D RCX technology file is made available to external customers. Next, an external customer extracts a product design from the design database 54 and applies that product design to a 2.5D RCX tool in block 56. As such, the external customer is able to generate an RCX result as shown in block 58. Based on the RCX result, the external customer is able to evaluate whether the new process feature developed by the foundry 32 is suitable for use in the product corresponding to the product design extracted from the design database 54. Unfortunately, the evaluation by the external customer may be negatively affected by the accuracy gap 42 between the 3D real profile and the 3D effective profile. However, use of the 3D effective profile may be the only prudent way for the foundry 32 to protect the sensitive or proprietary information found the real profile when the conventional process flow of FIG. 2 is employed.

Figure 3:
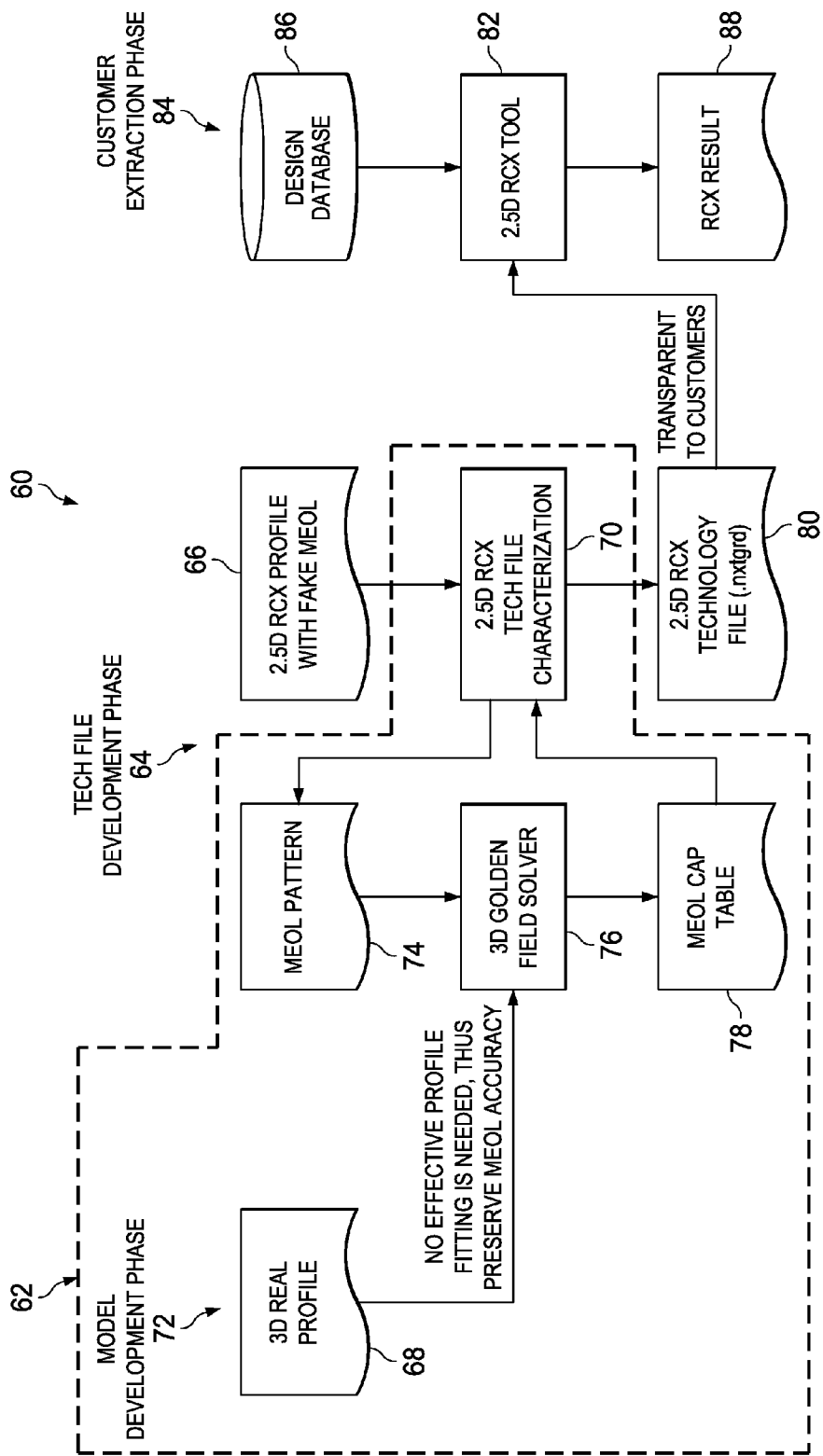
FIG. 3 illustrates an embodiment process development flow inside a foundry.

Referring now to FIG. 3, an embodiment development flow 60 inside a foundry 62 is illustrated. As will be more fully explained below, when the embodiment development flow 60 is used, the accuracy gap 23, 42 found in the development flows 10, 30 of FIGS. 1-2 is eliminated. Therefore, the external customer is able to evaluate whether a new process feature is suitable for use in their product using a real profile instead of an effective profile. Moreover, the foundry 62 is able to provide feedback to the company that designed the RCX tool so that the RCX tool can be improved without disclosing sensitive or proprietary information to the company, which may also provide that same RCX tool to competitors of the foundry 62.

As part of the tech file development phase 64, the foundry 62 provides the company that designed the RCX characterization tool with a fake MEOL profile in block 66. The fake MEOL profile may include simplified, approximated, generalized structure for new process feature, for example, ideal FinFET device profile. The fake MOEL profile are developed by the foundry 62 and based on the new process feature that was designed by the foundry 62. The fake MEOL profile does not reveal the actual structure or design of sensitive features within the new process feature. Rather, the fake MEOL profile are simplified, approximated, generalized, simulated, and so on in order to maintain the secrecy of the new process feature or features found in a 3D real profile in block 68.

In block 70, the fake profile is fed into the 2.5 RCX tech file characterization tool as part of the model development phase 72. The tool generates the MEOL pattern in block 74. As used herein, the tool may refer to software, hardware, firmware, or a combination thereof. The MEOL pattern of block 74 and the 3D real profile of block 68 are then input into a field solver (e.g., a 3D golden field solver) in block 76. The field solver in block 76 then generates a MEOL capacitance table in block 78. The MEOL capacitance table in block 78 is then read back to the 2.5 RCX tech file characterization tool in block 70 so that a capacitance database therein can be updated with the newly-generated capacitance information.

Next, the 2.5 RCX tech file characterization tool in block 70 generates the 2.5 RCX technology file in block 80. The technology file in block 80 is then provided to the customer for input into the 2.5D RCX tool in block 82 in the customer extraction phase 84. In an embodiment, the 2.5D RCX technology file is transparently provided to the customer.

Thereafter, to determine if the new process feature is suitable for a particular product of the customer, the customer obtains a design for a particular product from a design database in block 86. The design is then applied to the 2.5D RCX tool in block 82 to generate the RCX result in block 88. If the result is within acceptable parameters or meets certain thresholds, the customer knows that the new process feature (e.g., new FinFET) developed by the foundry 62 is suitable for that particular customer product (e.g., new customer chip). If, however, the result in block 88 is outside or beyond acceptable limits, the customer knows that the new process feature that the foundry 62 developed may not be suitable or the best choice for that particular customer product.

Notably, as shown in FIG. 3, the customer receives a 2.5D RCX tech file that is based on the 3D real profile. Because the 3D real profile is employed, no effective profile fitting is needed and the accuracy of the MEOL is preserved. In contrast, the 2.5D RCX tech file received by the customer in FIGS. 1-2 is based on the effective profile, which may suffer from the accuracy gap 23, 42.

Figure 4:
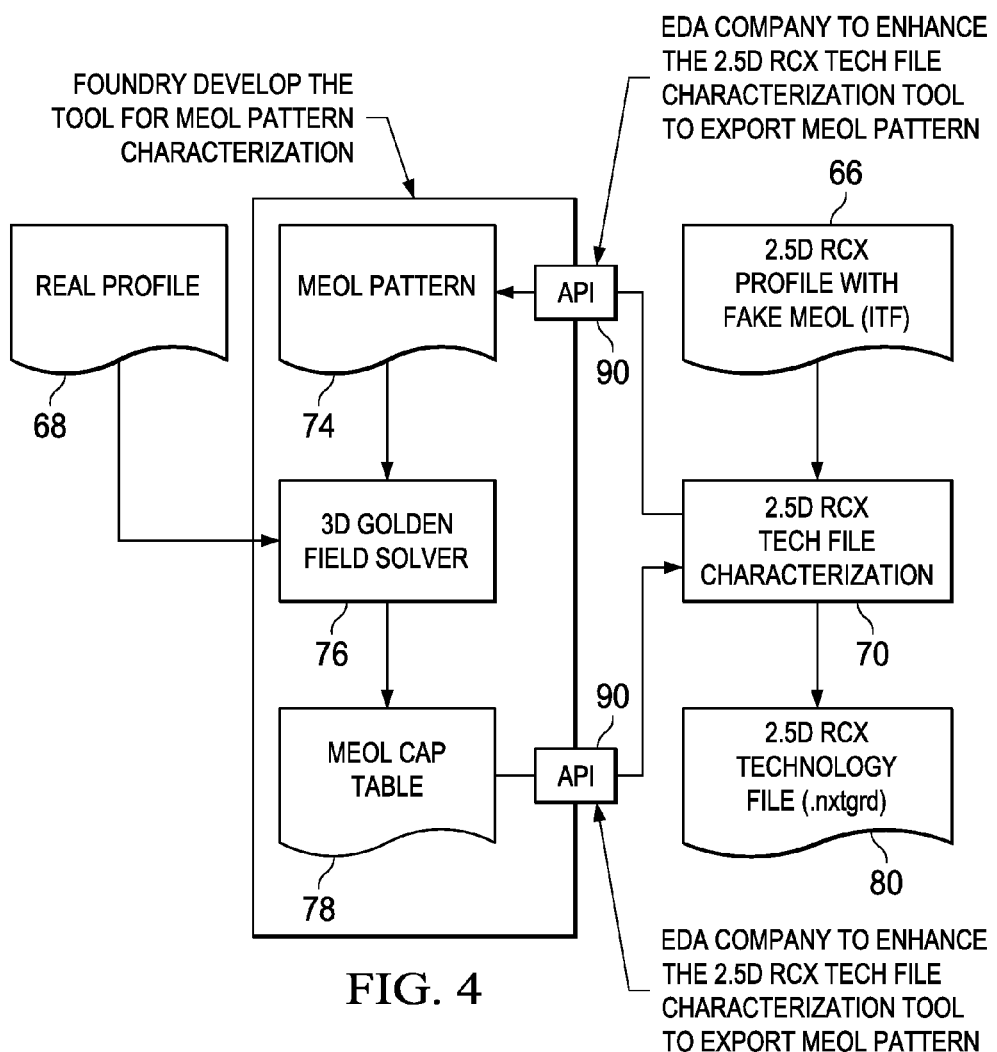
FIG. 4 illustrates a field solver from the embodiment process of FIG. 3 separate from the characterization tool.

Referring now to FIG. 4, in an embodiment the field solver in block 76 is separate from the 2.5 RCX tech file characterization tool in block 70. In other words, the field solver 76 and the 2.5 RCX tech file characterization tool in block 70 may be, or have been, developed by different companies. In such a case, an application programming interface (API) 90 is developed to permit communication between the field solver 76 and the 2.5 RCX tech file characterization tool in block 70. In an embodiment, the company that developed the 2.5 RCX tech file characterization tool in block 70 may enhance the tool in block 70 to export the MEOL pattern in block 74 through one API 90 and import the MEOL pattern into the tool using another API 90 as shown in FIG. 4.

Figure 5:
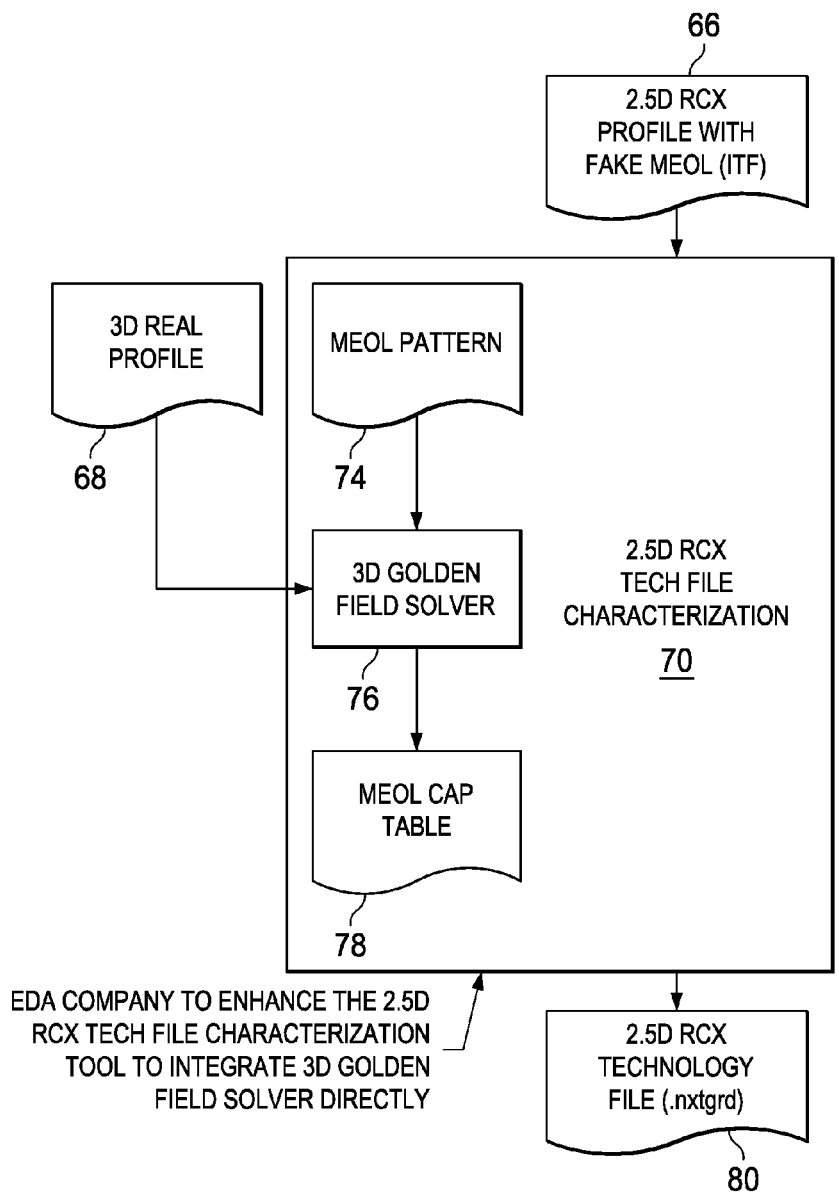
FIG. 5 illustrates a field solver from the embodiment process of FIG. 3 integrated into the characterization tool.

Referring now to FIG. 5, in an embodiment the field solver 76 is integrated into or a part of the 2.5 RCX tech file characterization tool in block 70. In such an embodiment, the company that developed the 2.5 RCX tech file characterization tool in block 70 is able to offer the field solver 76 as part of a complete package for handling the MEOL patterns and capacitance tables.

Figure 6:
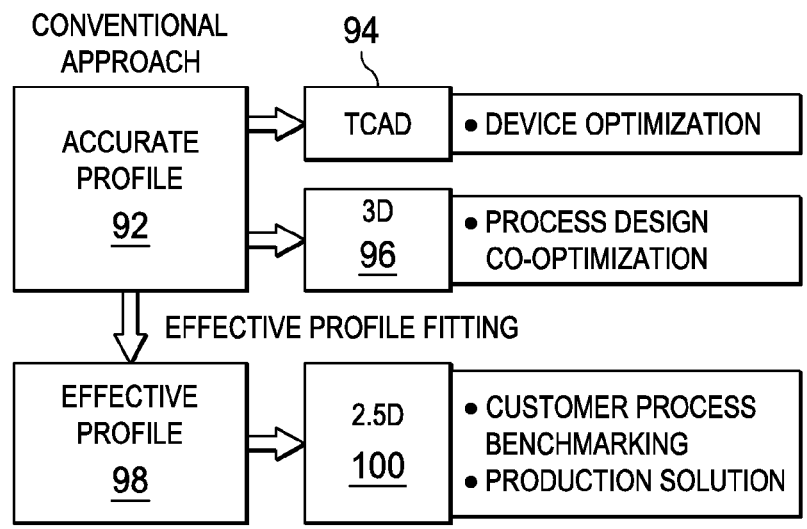
FIGS. 6-7 illustrate the difference between using the conventional approaches of FIGS. 1-2 and the embodiment approach of FIG. 3.
Figure 7:
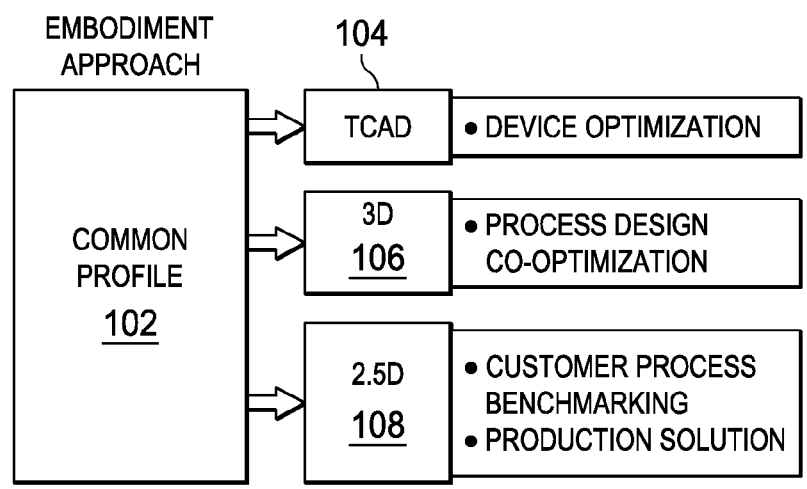

Referring collectively to FIGS. 6-7, the difference between using the conventional approaches of FIGS. 1-2 and the embodiment approach of FIG. 3 is comparatively illustrated. In FIG. 6, the real or accurate profile 92 is used to generate the technology computer aided design (TCAD) 94 and the 3D design 96. In contrast, the effective profile 98 generated through effective profile fitting is used to generate the 2.5D design 100, which undesirably introduces the accuracy gap. Because, for example, a FinFET is more complex than a planar device and three-dimensional (3D) parasitic effects are stronger, the effective profile fitting approach may suffer from a significant fitting error. For example, the effective profile fitting approach may introduce a fitting error of about five percent (~5%) in planar devices, which may be still acceptable. However, due to stronger three-dimensional (3D) parasitic effects of FinFET process, the fitting error may be as high as 10 percent (~10%) or larger, which will be an un-acceptable accuracy lose In contrast, and as shown in FIG. 7, a common profile 102 (e.g., a real 3D profile) is used to generate the TCAD profile 104, the 3D design 106, and the 2.5D design 108 using the embodiment approach of FIG. 3. As such, the effective profile and the accuracy gap of conventional approaches are eliminated. In other words, the same device profile can be used by a 3D tool and a 2.5D tool, which removes the effective profile fitting error. Moreover, there is no need to enable the RCX tool for realistic device structure handling, which reduces sensitive process information leakage risk and the need for RCX tool enhancement during any MEOL profile change.

Figure 8:
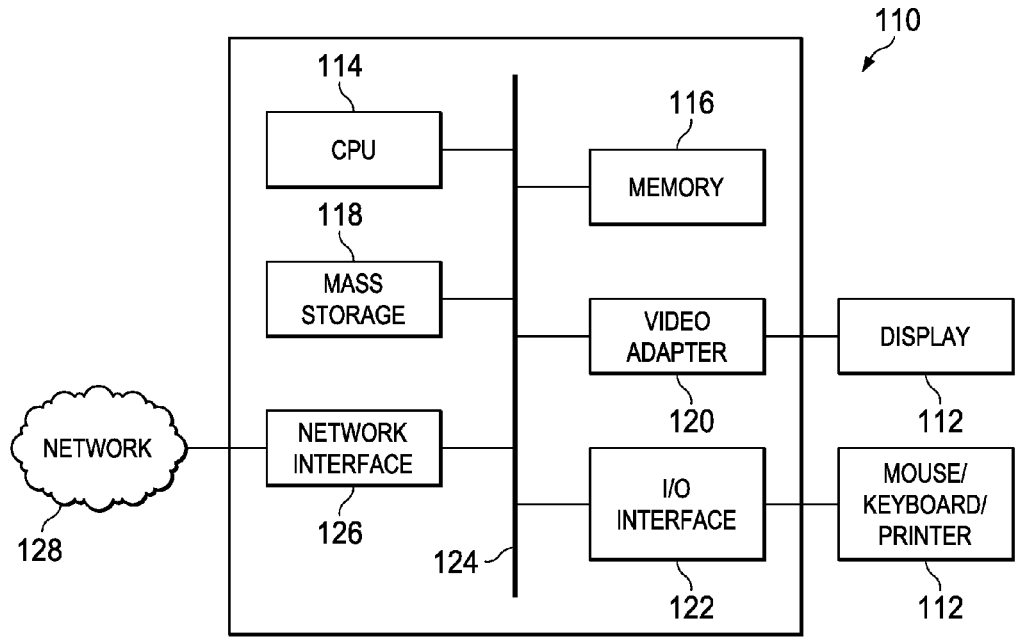
FIG. 8 is a block diagram of a processing system that may be used for implementing the embodiment method of FIG. 3.

FIG. 8 is a block diagram of a processing system 110 that may be used for implementing the methods and devices disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system 110 may comprise a processing unit equipped with one or more input/output devices 112, such as a speaker, microphone, mouse, touchscreen, keypad, keyboard, printer, display, and the like. The processing system 110 may include a central processing unit (CPU) 114, memory 116, a mass storage device 118, a video adapter 120, and an I/O interface 122 connected to a bus 124.

The bus 124 may be one or more of any type of several bus architectures including a memory bus or memory controller, a peripheral bus, video bus, or the like. The CPU 114 may comprise any type of electronic data processor. The memory 116 may comprise any type of system memory such as static random access memory (SRAM), dynamic random access memory (DRAM), synchronous DRAM (SDRAM), read-only memory (ROM), a combination thereof, or the like. In an embodiment, the memory 116 may include ROM for use at boot-up, and DRAM for program and data storage for use while executing programs.

The mass storage device 118 may comprise any type of storage device configured to store data, programs, and other information and to make the data, programs, and other information accessible via the bus 124. The mass storage device 118 may comprise, for example, one or more of a solid state drive, hard disk drive, a magnetic disk drive, an optical disk drive, or the like.

The video adapter 120 and the I/O interface 122 provide interfaces to couple external input and output devices to the processing unit. As illustrated, examples of input and output devices include the display coupled to the video adapter 120 and the mouse/keyboard/printer coupled to the I/O interface 122. Other devices may be coupled to the processing system 110, and additional or fewer interface cards may be utilized. For example, a serial interface such as Universal Serial Bus (USB) (not shown) may be used to provide an interface for a printer.

The processing system 110 also includes one or more network interfaces 126, which may comprise wired links, such as an Ethernet cable or the like, and/or wireless links to access nodes or different networks. The network interface 126 allows the processing system 110 to communicate with remote systems or units via the networks. For example, the network interface 126 may provide wireless communication via one or more transmitters/transmit antennas and one or more receivers/receive antennas. In an embodiment, the processing system 110 (a.k.a., processing unit) is coupled to a local-area network 128 or a wide-area network 128 for data processing and communications with remote devices, such as other processing units, the Internet, remote storage facilities, or the like.

Figure 9:
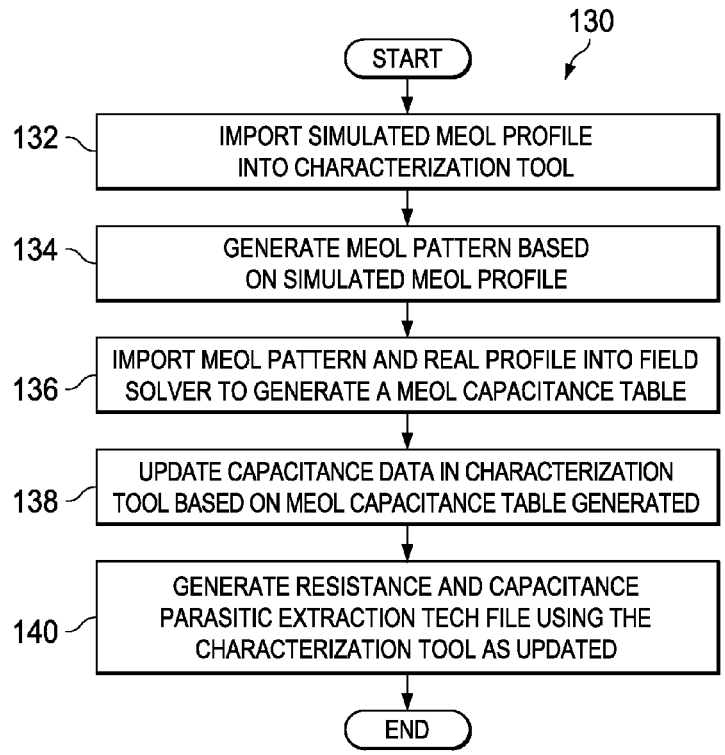
FIG. 9 illustrates an embodiment method of streamlining parasitic modeling using a common device profile.

Referring now to FIG. 9, an embodiment method 130 of streamlining parasitic modeling using a common device profile is illustrated. In block 132, a simulated middle end of line (MEOL) profile is imported into a characterization tool. In block 134, a MEOL pattern is generated based on the simulated MEOL profile. In block 136, the MEOL pattern and a real profile are imported into a field solver to generate a MEOL capacitance table. In block 138, capacitance data in the characterization tool is updated based on the MEOL capacitance table generated. In block 140, a resistance and capacitance parasitic extraction technology file is generated using the characterization tool with the capacitance data as updated.

Figure 10:
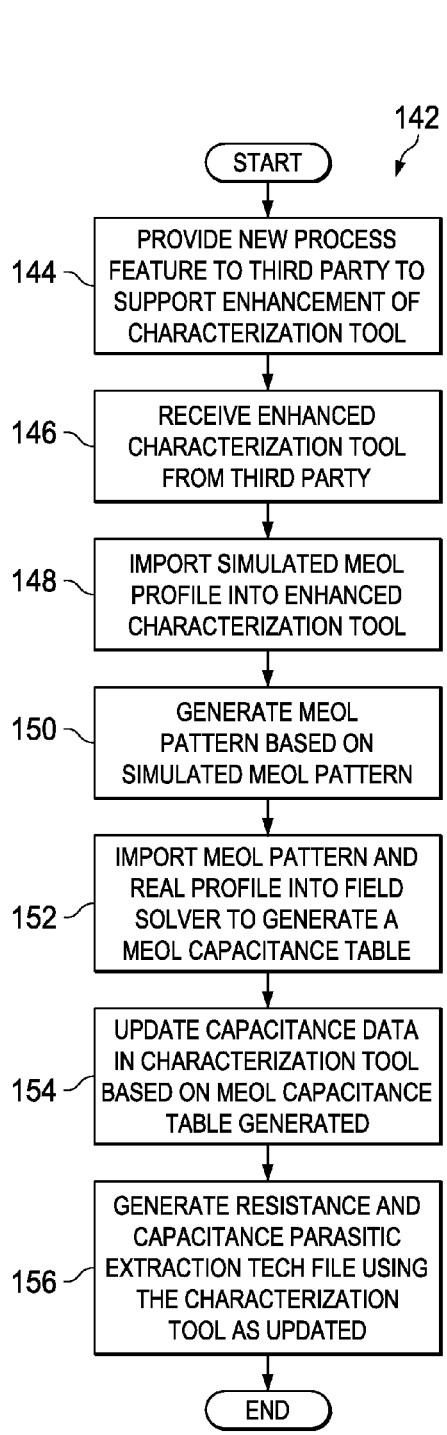
FIG. 10 illustrates another embodiment method of streamlining parasitic modeling using a common device profile.
Figure 11:
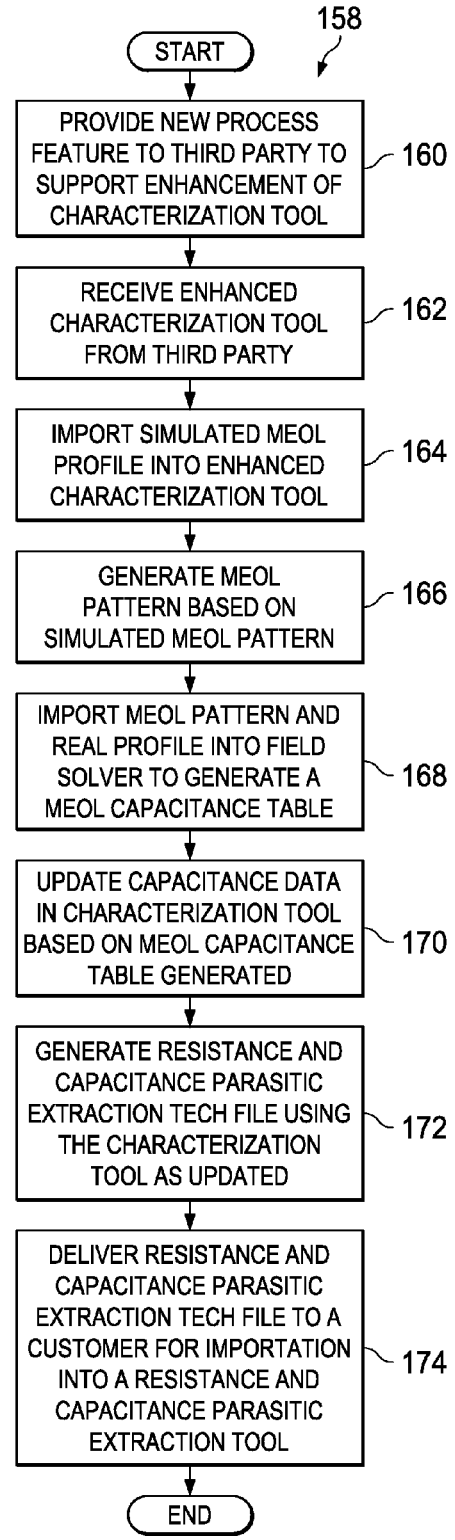
FIG. 11 illustrates another embodiment method of streamlining parasitic modeling using a common device profile.

Referring now to FIG. 10, an embodiment method 142 of streamlining parasitic modeling using a common device profile is illustrated. In block 144, a new process feature is provided to a third party to support enhancement of a characterization tool. In block 146, an enhanced characterization tool is received from the third party. The enhanced characterization tool is updated based on the new process feature. In block 148, a simulated middle end of line (MEOL) profile is imported into the enhanced characterization tool. In block 150, a MEOL pattern is generated based on the simulated MEOL profile. In block 152, the MEOL pattern and a real profile are imported into a field solver to generate a MEOL capacitance table. In block 154, capacitance data in the characterization tool is updated based on the MEOL capacitance table generated. In block 156, a resistance and capacitance parasitic extraction technology file is generated using the characterization tool with the capacitance data as updated.

Referring now to FIG. 10, an embodiment method 158 of streamlining parasitic modeling using a common device profile is illustrated. In block 160, a new process feature is provided to a third party to support enhancement of a characterization tool. In block 162, an enhanced characterization tool is received from the third party. The enhanced characterization tool is updated based on the new process feature. In block 164, a simulated middle end of line (MEOL) profile is imported into the enhanced characterization tool. In block 166, a MEOL pattern is generated based on the simulated MEOL profile. In block 168, the MEOL pattern and a real profile are imported into a field solver to generate a MEOL capacitance table. In block 170, capacitance data in the characterization tool is updated based on the MEOL capacitance table generated. In block 172, a resistance and capacitance parasitic extraction technology file is generated using the characterization tool with the capacitance data as updated. In block 174, the resistance and capacitance parasitic extraction tech file is delivered to a customer for importation into a resistance and capacitance parasitic extraction tool.

An embodiment method of streamlining parasitic modeling using a common device profile includes importing, using a processor, a simulated middle end of line (MEOL) profile into a characterization tool, generating, using the processor, a MEOL pattern based on the simulated MEOL profile, import, using the processor, the MEOL pattern and a real profile into a field solver to generate a MEOL capacitance table, updating, using the processor, capacitance data in the characterization tool based on the MEOL capacitance table generated, and generating, using the processor, a resistance and capacitance parasitic extraction technology file using the characterization tool with the capacitance data as updated.

An embodiment method of method of streamlining parasitic modeling using a common device profile includes providing new capacitance patterns corresponding to a new process feature to a third party to support enhancement of a characterization tool, receiving an enhanced characterization tool from the third party, the enhanced characterization tool updated based on the new process feature, importing, using a processor, a simulated middle end of line (MEOL) profile into the enhanced characterization tool, generating, using the processor, a MEOL pattern based on the simulated MEOL profile, import, using the processor, the MEOL pattern and a real profile into a field solver to generate a MEOL capacitance table, updating, using the processor, capacitance data in the characterization tool based on the MEOL capacitance table generated, and generating, using the processor, a resistance and capacitance parasitic extraction technology file using the characterization tool with the capacitance data as updated.

An embodiment method of method of streamlining parasitic modeling using a common device profile includes providing a fake MEOL profile corresponding to a new process feature to a third party to support enhancement of a characterization tool, receiving an enhanced characterization tool from the third party, the enhanced characterization tool updated based on the fake MOEL profile, importing, using a processor, a simulated middle end of line (MEOL) profile into the enhanced characterization tool, generating, using the processor, a MEOL pattern based on the simulated MEOL profile, import, using the processor, the MEOL pattern and a real profile into a field solver to generate a MEOL capacitance table, updating, using the processor, capacitance data in the characterization tool based on the MEOL capacitance table generated, generating, using the processor, a resistance and capacitance parasitic extraction technology file using the characterization tool with the capacitance data as updated, and delivering the resistance and capacitance parasitic extraction technology file to a customer for importation into a resistance and capacitance parasitic extraction tool.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of streamlining parasitic modeling using a common device profile, comprising:
    importing, using a processor, a simulated middle end of line (MEOL) profile into a characterization tool;
    generating, using the processor, a MEOL pattern based on the simulated MEOL profile;
    importing, using the processor, the MEOL pattern and a real profile into a field solver to generate a MEOL capacitance table;
    updating, using the processor, capacitance data in the characterization tool based on the MEOL capacitance table generated; and
    generating, using the processor, a resistance and capacitance parasitic extraction technology file using the characterization tool with the capacitance data as updated.

2. The method of claim 1, wherein the real profile is a three dimensional (3D) real profile.

3. The method of claim 1, wherein the field solver is a golden field solver.

4. The method of claim 1, wherein the field solver is a 3D golden field solver.

5. The method of claim 1, wherein the capacitance data is stored in a database in the characterization tool.

6. The method of claim 1, wherein the resistance and capacitance parasitic extraction technology file is a two-and-a-half dimension (2.5D) resistance and capacitance parasitic extraction technology file.

7. The method of claim 1, further comprising transparently delivering the resistance and capacitance parasitic extraction technology file to a customer for importation into a resistance and capacitance parasitic extraction tool.

8. The method of claim 1, further comprising providing a fake MEOL profile corresponding to a new process feature to a third party prior to the importing of the simulated MEOL profile, the fake MEOL profile permitting the third party to identify MEOL patterns to support the new process feature and update the characterization tool to support the new process feature.

9. The method of claim 1, wherein the characterization tool has been updated to support a new process feature prior to the simulated MEOL profile importation.

10. A method of streamlining parasitic modeling using a common device profile, comprising:
    providing new capacitance patterns corresponding to a new process feature to a third party to support enhancement of a characterization tool;
    receiving an enhanced characterization tool from the third party, the enhanced characterization tool updated based on the new process feature;
    importing, using a processor, a simulated middle end of line (MEOL) profile into the enhanced characterization tool;
    generating, using the processor, a MEOL pattern based on the simulated MEOL profile;
    importing, using the processor, the MEOL pattern and a real profile into a field solver to generate a MEOL capacitance table;
    updating, using the processor, capacitance data in the characterization tool based on the MEOL capacitance table generated; and
    generating, using the processor, a resistance and capacitance parasitic extraction technology file using the characterization tool with the capacitance data as updated.

11. The method of claim 10, wherein the new process feature corresponds to a fin field effect transistor (FinFET).

12. The method of claim 10, wherein the new process feature corresponds to a three dimensional structure.

13. The method of claim 10, wherein the real profile is a three dimensional (3D) real profile and the resistance and capacitance parasitic extraction technology file is a two-and-a-half dimension (2.5D) resistance and capacitance parasitic extraction technology file.

14. The method of claim 10, the field solver is a golden field solver.

15. The method of claim 10, further comprising transparently delivering the resistance and capacitance parasitic extraction technology file to a customer for importation into a resistance and capacitance parasitic extraction tool.

16. A method of streamlining parasitic modeling using a common device profile, comprising:
    providing a fake middle end of line (MEOL) profile corresponding to a new process feature to a third party to support enhancement of a characterization tool;
    receiving an enhanced characterization tool from the third party, the enhanced characterization tool updated based on the fake MEOL profile;
    importing, using a processor, a simulated MEOL profile into the enhanced characterization tool;
    generating, using the processor, a MEOL pattern based on the simulated MEOL profile;
    importing, using the processor, the MEOL pattern and a real profile into a field solver to generate a MEOL capacitance table;
    updating, using the processor, capacitance data in the characterization tool based on the MEOL capacitance table generated;
    generating, using the processor, a resistance and capacitance parasitic extraction technology file using the characterization tool with the capacitance data as updated; and delivering the resistance and capacitance parasitic extraction technology file to a customer for importation into a resistance and capacitance parasitic extraction tool.

17. The method of claim 16, the real profile is a three dimensional (3D) real profile and the resistance and capacitance parasitic extraction technology file is a two-and-a-half dimension (2.5D) resistance and capacitance parasitic extraction technology file.

18. The method of claim 16, the field solver is a 3D golden field solver.

19. The method of claim 16, wherein the capacitance data is stored in a database in the characterization tool.

20. The method of claim 16, wherein the new process feature corresponds to a fin field effect transistor (FinFET).

* * * * *